US008551886B2

(12) United States Patent
Hunt et al.

(10) Patent No.: US 8,551,886 B2
(45) Date of Patent: Oct. 8, 2013

(54) CMP PROCESS FOR PROCESSING STI ON TWO DISTINCT SILICON PLANES

(75) Inventors: Kyle P. Hunt, Richardson, TX (US); Leila Elvira Noriega, Forney, TX (US); Billy Alan Wofford, Dallas, TX (US); Asadd M. Hosein, Plano, TX (US); Binghua Hu, Plano, TX (US); Xinfen Chen, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 636 days.

(21) Appl. No.: 12/100,118

(22) Filed: Apr. 9, 2008

(65) Prior Publication Data

US 2009/0170317 A1 Jul. 2, 2009

Related U.S. Application Data (60) Provisional application No. 61/017,207, filed on Dec. 28, 2007.

(51) Int. Cl.
*H01L 21/302* (2006.01)
*H01L 21/3105* (2006.01)

(52) U.S. Cl.
CPC ..... *H01L 21/31051* (2013.01); *H01L 21/31053* (2013.01); *H01L 21/31055* (2013.01); *H01L 21/31056* (2013.01)
USPC ........... 438/692; 438/300; 438/633; 438/689; 438/697; 438/734; 438/733; 438/722; 438/723; 438/724; 257/500; 257/501; 257/506; 257/E21.214; 257/E21.218; 257/E21.243; 257/E21.244; 257/E21.245; 257/E21.246; 257/E21.303; 257/E21.304; 257/E21.311; 257/E29.261

(58) Field of Classification Search
CPC ............... H01L 21/31051; H01L 21/31053; H01L 21/31055; H01L 21/31056
USPC ......... 438/692, 634, 633, 734, 733, 697, 689, 438/300, 722, 723, 724; 257/506, E21.218, 257/E21.304, E21.311, E21.244, 500, 501, 257/E21.214, E21.243, E21.245, E21.246, 257/E21.303, E21.305, E29.261
See application file for complete search history.

(56) References Cited

U.S. PATENT DOCUMENTS

| | | | |
|---|---|---|---|
| 5,909,628 A | 6/1999 | Chatterjee et al. | |
| 6,025,270 A * | 2/2000 | Yoo | 438/697 |
| 6,372,605 B1 * | 4/2002 | Kuehne et al. | 438/427 |
| 6,905,967 B1 * | 6/2005 | Tian et al. | 438/697 |

(Continued)

*Primary Examiner* — Lan Vinh
*Assistant Examiner* — David Kaufman
(74) *Attorney, Agent, or Firm* — Michael A. Davis, Jr.; Warren Franz; Frederick J. Telecky, Jr.

(57) ABSTRACT

A method for semiconductor processing is provided wherein a workpiece having an underlying body and a plurality of features extending therefrom, is provided. A first set of the plurality of features extend from the underlying body to a first plane, and a second set of the plurality features extend from the underlying body to a second plane. A protection layer overlies each of the plurality of features and an isolation layer overlies the underlying body and protection layer, wherein the isolation has a non-uniform first oxide density associated therewith. The isolation layer anisotropically etched based on a predetermined pattern, and then isotropically etched, wherein a second oxide density of the isolation layer is substantially uniform across the workpiece. The predetermined pattern is based, at least in part, on a desired oxide density, a location and extension of the plurality of features to the first and second planes.

16 Claims, 7 Drawing Sheets

(56) References Cited

U.S. PATENT DOCUMENTS

| | | | |
|---|---|---|---|
| 2002/0065023 A1* | 5/2002 | Kwok | 451/37 |
| 2004/0152397 A1* | 8/2004 | Levi et al. | 451/29 |
| 2004/0266111 A1* | 12/2004 | Lee | 438/264 |
| 2005/0026382 A1* | 2/2005 | Akatsu et al. | 438/386 |
| 2005/0110073 A1* | 5/2005 | Spadea | 257/315 |
| 2005/0258471 A1* | 11/2005 | Lee | 257/296 |
| 2005/0272194 A1* | 12/2005 | Kim | 438/300 |

* cited by examiner

CMP PROCESS FOR PROCESSING STI ON TWO DISTINCT SILICON PLANES

REFERENCE TO RELATED ART

This application claims priority to and the benefit of U.S. Provisional Application Ser. No. 61/017,207 which was filed Dec. 28, 2007, entitled CMP PROCESS FOR PROCESSING STI ON TWO DISTINCT SILICON PLANES, the entirety of which is hereby incorporated by reference as if fully set forth herein.

FIELD OF THE INVENTION

The present invention relates generally to semiconductor processing, and more particularly to a method for processing STI layers on multiple planes of a substrate.

BACKGROUND OF THE INVENTION

Semiconductor processing often involves the formation of components having varying voltage inputs in neighboring regions of a semiconductor wafer. For example, high-voltage components (e.g., transistors such as DMOS having voltages/currents up to 100V/2 A) are formed in one region of the wafer, while lower-voltage components (e.g., CMOS and flash components) are formed in a neighboring region. In low-voltage, non-analog semiconductor processing, the semiconductor processing typically starts at moat formation, or shallow trench isolation (STI), wherein initially the wafer is flat and the silicon is substantially planar.

In high-voltage analog mixed signal processing, on the other hand, multiple processing steps occur prior to moat or STI formation. For example, a plurality of highly-doped wells are formed in the semiconductor wafer, an oxide layer is formed over the wells, and the oxide layer is subsequently etched. Typically, differential oxidation is produced in the highly doped well areas, therein defining a recess or "step" in the silicon plane having a step height associated therewith. In the high-voltage regions, significant step height differentials in the silicon plane (e.g., 1000-2000 angstroms or more) are common, whereas such step heights are not present in lower-voltage regions, such as the regions undergoing standard CMOS processing.

High-voltage analog devices are commonly formed utilizing local oxidation of silicon (LOCOS), wherein the isolation is "grown" by oxidation. With ever-decreasing feature sizes, however, a subsequent polishing step is typically needed for the high voltage regions, wherein trenches are polished to accommodate the smaller feature sizes, thus making LOCOS less desirable in forming the isolation as feature sizes decrease. Thus, it is common for a trench to be etched, an oxide film deposited thereon, and then the oxide film over the trench is subsequently polished. The polishing step, however, is not local to the high-voltage region, but rather, is applied to the entire wafer, wherein both high-voltage regions and low-voltage regions can co-exist. It is therefore common for oxide densities (a measure of variation in oxide thickness) to be approximately 25% in high-voltage regions, while oxide densities in low-voltage regions are closer to 100%. Thus, various problems and concerns have arisen related to uniform polishing of wafers having multi-planar silicon surfaces in combination with varying oxide densities across the wafer.

Buried layers in the semiconductor substrate present further difficulties during polishing steps. For example, a deepN feature having a top surface that is recessed from the top plane of the substrate can be troublesome. In order to remove the oxide layer residing over the deepN feature, portions of a protective layer (e.g., a nitride layer) that exists over all of the features should also be removed during the polish step. For example, the oxide layer residing over the recessed deepN feature should be removed in order for a subsequent wet etch to remove the remaining nitride layer. However, since the deepN feature is recessed from the remaining features, removal of a greater portion of the nitride layer overlying the remaining features is necessary in order to reach the nitride layer overlying the deepN feature. If not controlled adequately, an over-polish of the nitride layer overlying the remaining features can have deleterious effects on the underlying features, wherein portions of the remaining features are damaged by the polish.

Thus, in combination, polishing rates across the wafer in low-voltage regions, high-voltage regions, and buried layer regions can vary due, at least in part, to the variabilities in oxide densities associated with each region, as well as requirements associated with reaching recessed features, such as deepN features. In other words, variabilities in polishing rates across the workpiece commonly occur due to feature density and planarity differences across the workpiece. Such variabilities or inconsistencies in polishing rates leads to undesirable rework and productivity losses.

SUMMARY OF THE INVENTION

Accordingly, a need exists for more uniform polishing of a workpiece having a mixture of low- and high-voltage features formed thereon, as well as having varying semiconductor planes associated therewith. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a method for semiconductor processing, wherein a patterned semiconductor workpiece is provided. The workpiece comprises an underlying body having a plurality of features extending therefrom, wherein a first set of the plurality of features extend from the underlying body to a first plane, and wherein a second set of the plurality features extend from the underlying body to a second plane. The second plane, for example, is recessed from the first plane. A protection layer is further provided overlying each of the plurality of features, and an isolation layer overlies the underlying body and protection layer. A surface of the isolation layer (e.g., an oxide layer) therein defines a first contour thereof, wherein a first plurality of peaks and valleys in the surface of the isolation layer are associated with a position of the plurality of features with respect to one another. A first density of the first plurality of peaks and valleys is further substantially non-uniform across the first contour.

According to one aspect of the disclosure, the isolation layer is anisotropically etched in a predetermined pattern, therein removing a first portion of the isolation layer. The predetermined pattern is based, at least in part, on a relative position of the plurality of features with respect to the one another and a desired pattern density. For example, the predetermined pattern is based, at least in part, on a position of the first set of the plurality of features with respect to a position of the second set of the plurality of features. In one example, the workpiece comprises at least a first region and a second region, wherein the first region comprises only features selected from the first set of the plurality features, and wherein second region comprises features selected from both the first set and second set of the plurality of features.

According to another aspect of the disclosure, the isolation is globally isotropically etched after the anisotropic etch, therein removing a second portion of the isolation layer and defining a second contour of the isolation layer having a second plurality of peaks and valleys associated therewith. A second density of the second plurality of peaks and valleys is therefore defined, wherein the second density is substantially uniform across the workpiece. Accordingly, a subsequent polishing the workpiece therein generally removes portions of the isolation layer overlying the plurality of features in a substantially uniform manner, wherein damage to any of plurality of features is minimized.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is generally directed towards uniformly processing a semiconductor workpiece having a varying device densities and multiple semiconductor planes associated therewith. In particular, the invention provides a method for preparing the workpiece for a chemical-mechanical polish, wherein the chemical-mechanical polish uniformly polishes the workpiece across a surface thereof. Accordingly, the present invention will now be described with reference to the drawings, wherein like reference numerals are used to refer to like elements throughout. It should be understood that the description of these aspects are illustrative and should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
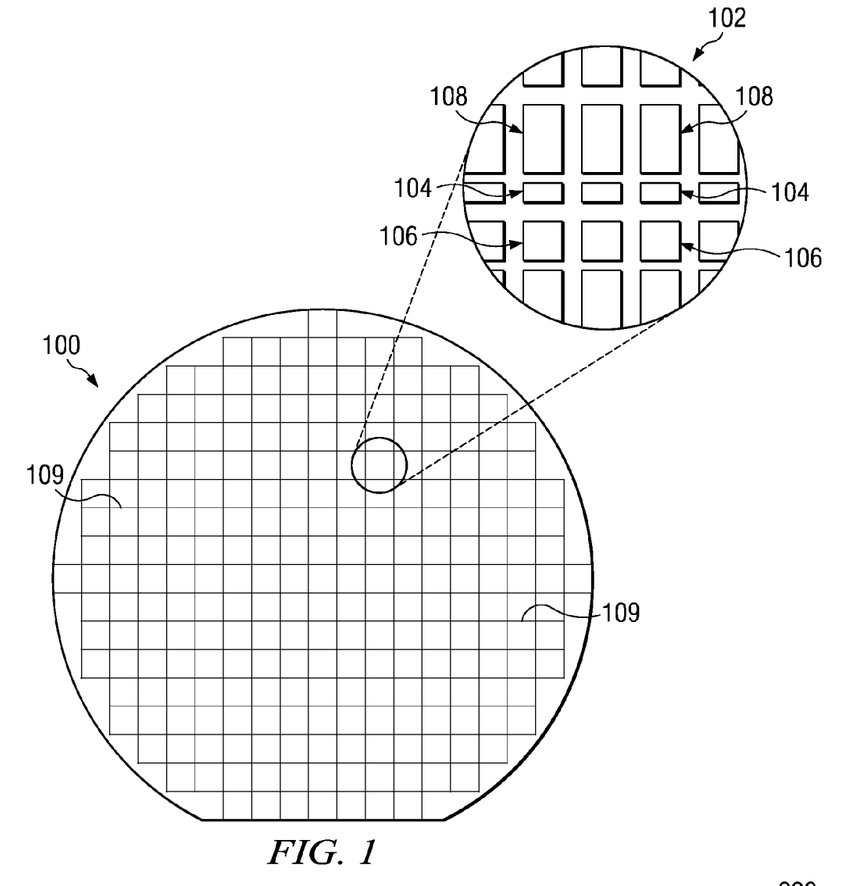
FIG. 1 illustrates an example of a semiconductor workpiece according to one aspect of the invention.

By way of example, as illustrated in FIG. 1, a workpiece 100 is shown along with a blown-up portion 102, wherein a first region 104, a second region 106, and a third region 108 of the workpiece are illustrated. In the present example, the portion 102 of the workpiece 100 is representative of a configuration of the entire workpiece, wherein the first, second, and third regions 104, 106, and 108 are similarly dispersed across the entire workpiece. Each of the first, second, and third regions 104, 106, and 108, for example, is repeated across the workpiece for the eventual formation of a plurality of semiconductor devices or chips 109. In the present example, each of first, second, and third regions 104, 106, and 108 has a differing density and/or configuration of a plurality of features 110 illustrated in FIGS. 2A-2C associated therewith, as will be discussed in greater detail hereafter. For example, the first, second, and third regions 104, 106, and 108 of FIG. 1 may be comprised of various devices (not shown) having varying input and/or output voltages or other characteristics associated therewith. It should be noted that the workpiece 100 may comprise any number of regions having any number of configurations and densities, and is not limited by the regions, densities, and configurations illustrated. In the past, differing densities (e.g., the number of features per unit area) and/or configurations across the workpiece 100 have been known to cause difficulties when polishing steps are undertaken. The present invention advantageously alleviates such difficulties, as will be discussed infra.

Figure 2A:
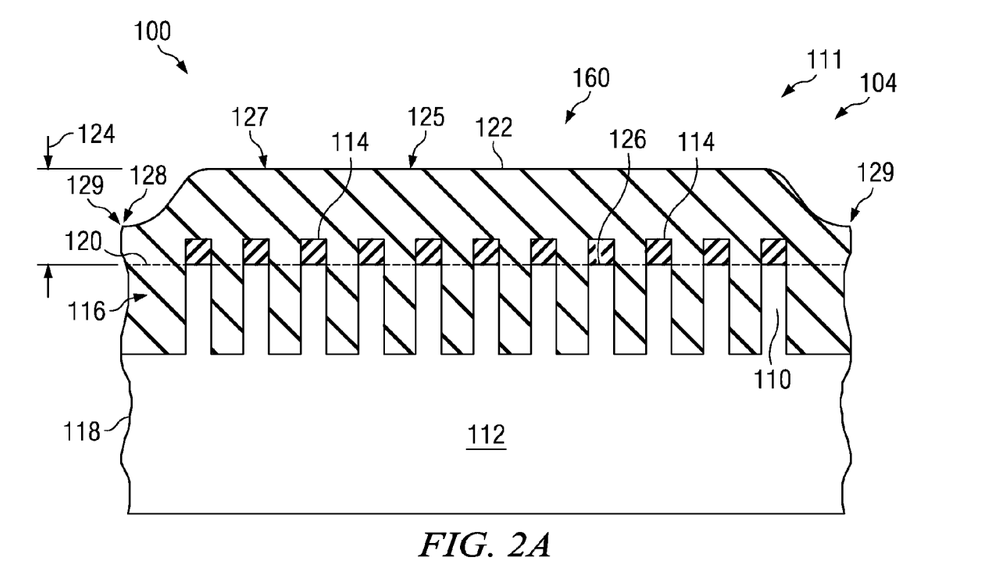
FIGS. 2A-2C illustrate an example of several regions of a semiconductor workpiece having an oxide layer formed thereon.

Referring now to FIG. 2A, the first region 104, for example, is a low-voltage region 111 (e.g., a region associated with flash memory) of the workpiece 100. The workpiece 100, for example, comprises a patterned semiconductor substrate 112, wherein a protection layer 114 (e.g., a nitride layer) has been formed thereon prior to patterning. For example, the substrate 112 and protection layer 114 have been previously etched to form a first set 116 of the plurality of features 110 (e.g., a plurality of densely-packed low-voltage features) extending from an underlying body 118 of the semiconductor substrate to a first plane 120 of the semiconductor substrate.

As illustrated, an isolation layer 122 (e.g., an oxide layer or other dielectric layer) has been further formed or deposited over the substrate 112 and protection layer 114 after patterning using conventional techniques, wherein a thickness 124 of the isolation layer from the first plane 120 (e.g., a top plane of the first set 116 of the plurality of features 110 or, alternatively, a top plane of the protection layer overlying the first set of features) to a top surface 125 of the isolation layer in the first region 104 is relatively large. The relatively large and generally uniform thickness 124 of the isolation layer 122 in the first region 104 is generally caused by the packing of the plurality of features 110 being quite dense in the first region (e.g., also called a "high oxide area"). Further, the features of the first set 116 of the plurality of features 110 all extend to the first plane 120 of the substrate 112 in a generally uniform manner in the first region 104, wherein none of the first set of features has a surface 126 that is recessed from the first plane 120. Accordingly, the top surface 125 of the isolation layer 122 is substantially planar (e.g., a generally contiguous peak 127 extending over the first set 116 of the plurality of features 110), and the thickness 124 of the isolation layer is substantially uniform in the first region 104, reaching up to 100% oxide density over the low-voltage region 111, wherein dips or valleys 128 are substantially only present at boundaries 129 where the first set 116 features 110 are generally not present.

Figure 2B:
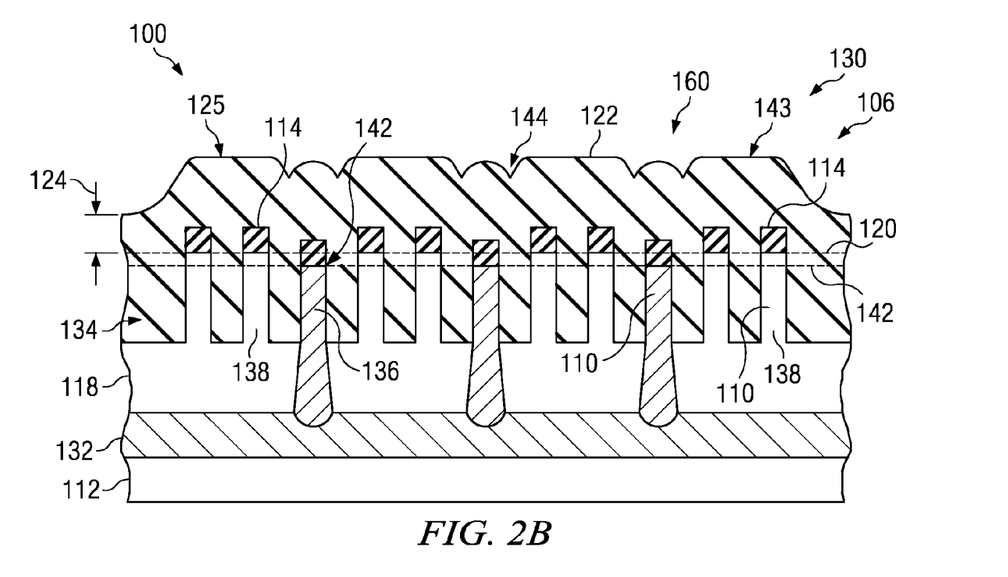

In FIG. 2B, the second region 106 of the workpiece 100 is illustrated, wherein the second region is associated with a buried layer region 130. The second region 106, for example, is associated with a conventional n+ buried layer (NBL) 132, wherein the second region comprises a second set 134 of the plurality of features 110. The second set 134 of the plurality of features 110, for example, comprises a deepN feature 136 and one or more neighboring features 138, wherein the deepN feature extends from the underlying body 118 (e.g., from the NBL 132) of the semiconductor substrate 112 to a second plane 142, and wherein the second plane differs from the first plane 120. For example, the second plane 142 (e.g., a top plane of the deepN feature 136, or alternatively, a top plane of the protection layer 114 overlying the deepN feature) is recessed from the first plane 120 of the substrate 112. Accordingly, the thickness 124 of the isolation layer 122 varies in the second region 106, based on the presence of the deepN feature 136 (e.g., thus causing one or more peaks 143 in the isolation layer), the difference between the first plane 120 and the second plane 142, and the density of the neighboring features 138, wherein dips or valleys 144 between the features 110 may be present.

Figure 2C:
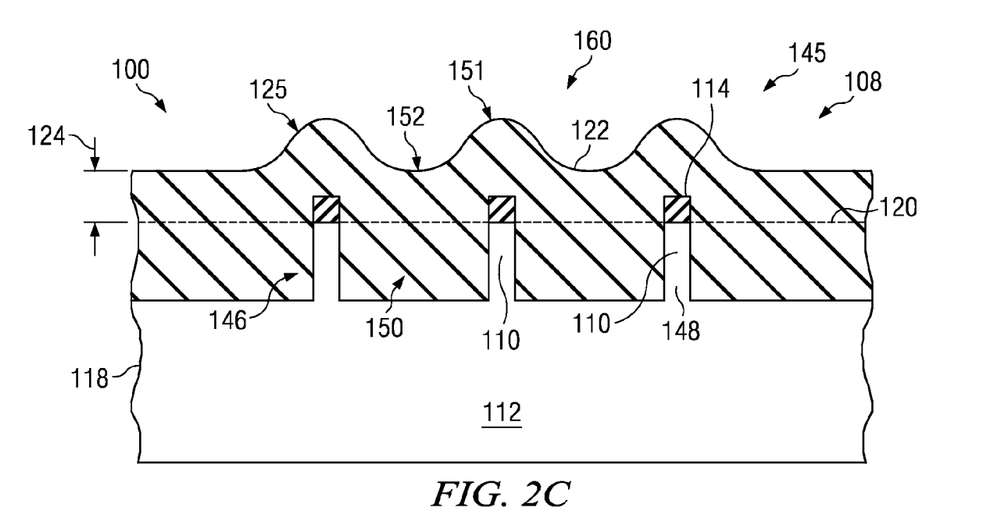

In FIG. 2C, the third region 108 (e.g., a high voltage or DMOS region 145 associated with DMOS devices) of the workpiece 100 is illustrated having a third set 146 of the plurality of features 110. The third set 146 of the plurality of features 110, for example, comprises one or more high-voltage features 148 extending from the underlying body 118 of the semiconductor substrate 112 to the first plane 120, wherein the one or more high-voltage features are substantially spaced apart from surrounding features. Thus, the formation or deposition of the isolation layer 122 discussed above readily fills etched areas 150 of the third region 108, and a large variability in the thickness 124 of the isolation layer 122 exists across the third region. The variation, for example, is based, at least in part, on the presence or absence of the high-voltage feature(s) 148. Thus, one or more peaks 151 and one or more valleys or dips 152 are present in the isolation layer 122 in the third region 108 (e.g., on the order of 25% oxide density or a 1:4 ratio of peaks to valleys), thus causing the surface 125 of the isolation layer to be inconsistent and, in places, significantly lower than the surface of the isolation layer in either of the first region 104 or second region 106 illustrated in FIGS. 2A and 2B.

Accordingly, if a conventional polishing (e.g., a chemical-mechanical polish or CMP) of the workpiece 100 were to be undertaken while the isolation layer 122 is in the configuration of FIGS. 2A-2C, inconsistencies in polishing rates may been experienced between the first regions 104, second regions 106, and third regions 106 of FIGS. 1 and 2A-2C, thus leading to a potential under-polish in the low-voltage regions 111 and buried layer regions 130, and/or a potential over-polish in the high-voltage regions 145. For example, the isolation layer 122 should be polished across the workpiece 100 in order to expose the underlying protection layer 114 residing over the plurality of features 110. Thus, an adequate removal of the isolation layer 122 from all of the plurality of features 110 of FIGS. 2A-2C generally permits a subsequent wet etch of the remaining protection layer 114. However, in order to remove the isolation layer 122 residing over the deepN feature 136 of FIG. 2B, for example, portions of the protection layer 114 that are present over neighboring features 138 should also be removed during polishing in order to reach the protection layer residing over the deepN feature (e.g., associated with the second plane 142) to allow for a subsequent wet etch of the isolation layer. Further, if the workpiece 100 were to be polished in the state illustrated in FIGS. 2A-2C, polishing rates across the first region 104 of FIG. 2A would be significantly slower than polishing rates across the second region 106. As such, an adequate removal of the isolation layer 122 can be difficult in the first and second regions 104 and 106 without damaging the underlying features 148 in the third region.

Accordingly, the present invention advantageously standardizes a topography or contour of the isolation layer 122 across the workpiece 100, such that an optimal polishing of the entire workpiece can be achieved, as will be discussed hereafter. In accordance with one aspect of the present invention, the workpiece of FIGS. 1 and 2A-2C is provided, wherein a first contour 160 of the isolation layer 122 is defined. The first contour 160 of the isolation layer 160, for example, is associated with the peaks 127, 143, and 151 and valleys 128, 144, and 152 of FIGS. 2A-2C, wherein a first density (e.g., area ratio of peaks to total peaks and valleys) is substantially non-uniform across the first contour (e.g., the peaks and valleys are not uniformly distributed across each chip 109 of FIG. 1). For example, the workpiece of pending co-owned U.S. patent application Ser. No. 11/694,700 may be provided, wherein the contents of the pending co-owned U.S. Patent Application are incorporated by reference herein, in their entirety.

In accordance with the invention, the isolation layer 122 of the workpiece 100 is etched in a predetermined pattern such that the topography or contour of the isolation layer has a resultant substantially uniform density for subsequent polishing, as will now be discussed. Providing such a uniform density of the contour of the isolation layer 122 advantageously permits a uniform polishing of the workpiece 100, such that the isolation layer is removed from all of the plurality of features 110 with minimal damage to any of the plurality of features.

According to one example, the predetermined pattern is based, at least in part, on a relative position of the plurality of features 110 with respect to one another and a desired pattern density. The desired pattern density, for example, is based on the least dense isolation layer 122 of the first, second, and third regions 104, 106, and 108 of FIGS. 2A-2C. For example, the third region 108 of FIG. 2C has approximately a 25% oxide density (e.g., an area ratio of peaks 151 to total peaks 151 and valleys 152 of approximately 1:4). As such, the desired pattern density is selected to be approximately a 25% density. The predetermined pattern is further based on a position of the deepN feature 136, as will be discussed infra.

Figure 3:
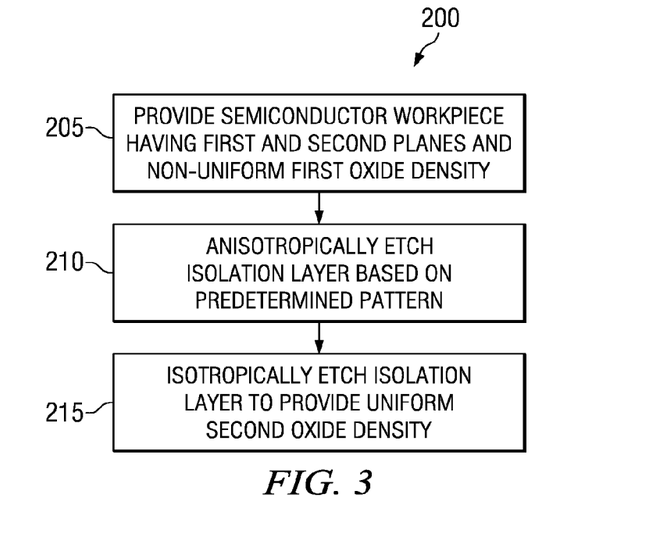
FIG. 3 illustrates a block diagram schematic of a method for processing a semiconductor workpiece in accordance with one example of the present invention.

In order to gain a better understanding of the invention, one example method 200 for processing the example workpiece 100 is provided in FIG. 3. Further, FIGS. 4A-4C and 5A-5C will be referenced with respect to the example. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Referring to FIG. 3, the method 200 begins with providing a semiconductor workpiece, such as the workpiece 100 of FIGS. 1, 2A-2C in act 205. It should be noted that the workpiece 100 may be provided with one or more of the first set 116, second set 134, and third set 146 of the plurality of features respectively associated with the first region 104, second region 106, and third region 108, and that any combination thereof is contemplated as falling within the scope of the present invention. For example, the workpiece 100 may be provided with only features 110 associated with the first region 104 and second region 106.

Alternatively, the workpiece 100 may be provided with only features 110 associated with the second region 106 and third region 108, or other regions (not shown) may be further provided having differing architectures. Accordingly, the isolation layer 122 may have a differing first contour 160 based on the architecture; however, the first density of the associated respective peaks 127, 143, and 151 and valleys 128, 144, and 152 is nonetheless non-uniform across the first contour.

Figure 4A:
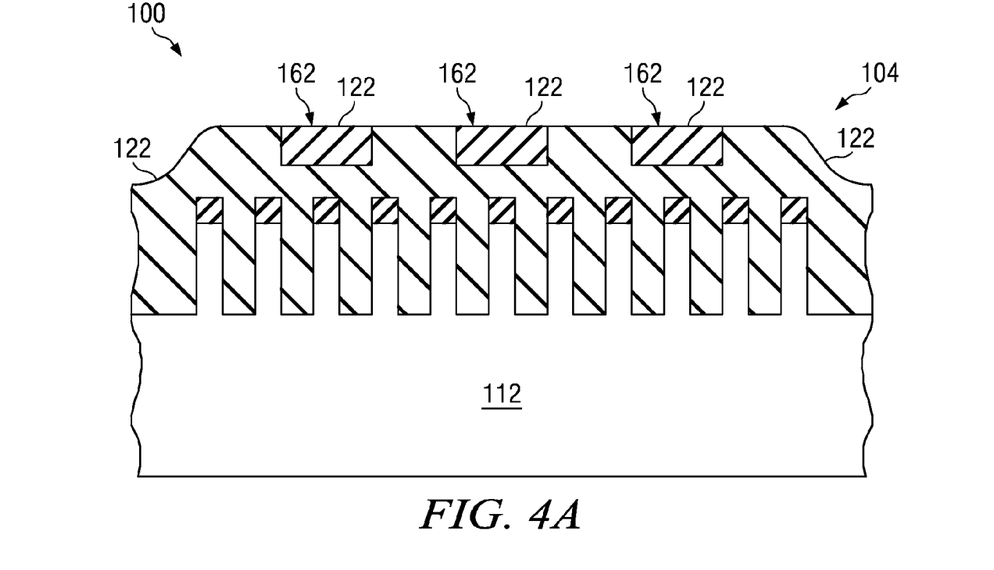
FIGS. 4A-4C illustrate various regions of an example workpiece undergoing processing in accordance with the present invention.
Figure 4B:
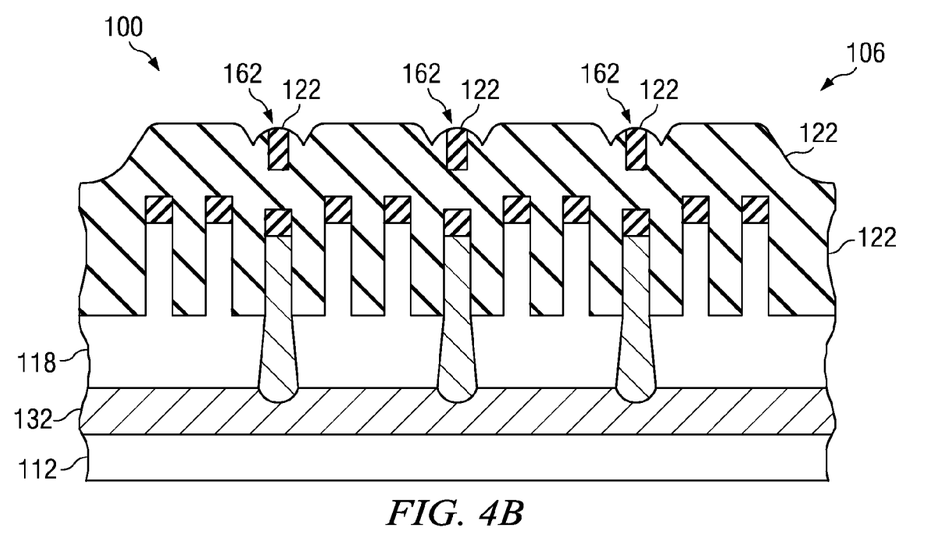
Figure 4C:
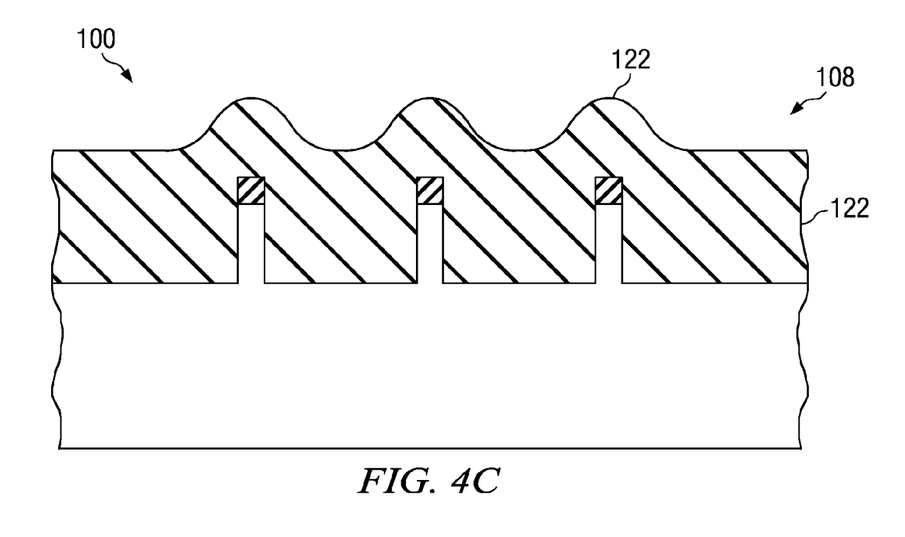

According to FIG. 3, the isolation layer is anisotropically etched based on the predetermined pattern in act 210, therein removing a first portion of the isolation layer. FIGS. 4A-4C illustrate several aspects of the present invention, wherein the first portion 162 of the isolation layer 122 is removed via the anisotropic etch of act 210. The first portion 162 of the isolation layer 122, for example, is removed by forming a masking layer (not shown) over the isolation layer, patterning the masking layer using a reticle (not shown), wherein openings (not shown) associated with predetermined pattern are formed in the masking layer, and dry etching the isolation layer using the masking layer as a mask. Dry etching, for example, may comprise reactive ion etching, or other anisotropic etching processes. The anisotropic etch of act 210 of FIG. 3, for example, may be performed in one or more of the first region 104, second region 106, and third region 108 of FIGS. 4A-4C, based on the desired device density and the relative position and planarity of the plurality of features 110. For example, for a desired device density of approximately 25%, the anisotropic etch of the third region 108 of FIG. 4C is unnecessary, since the device density of the third region is already approximately 25%. Further, due to the deepN features 136 of FIG. 4B being recessed from the first plane 120 on the second plane 142, the first portion(s) 162 of the second region 106 can be anisotropically etched to further provide an ultimately uniform oxide density, as will be further discussed.

Figure 5A:
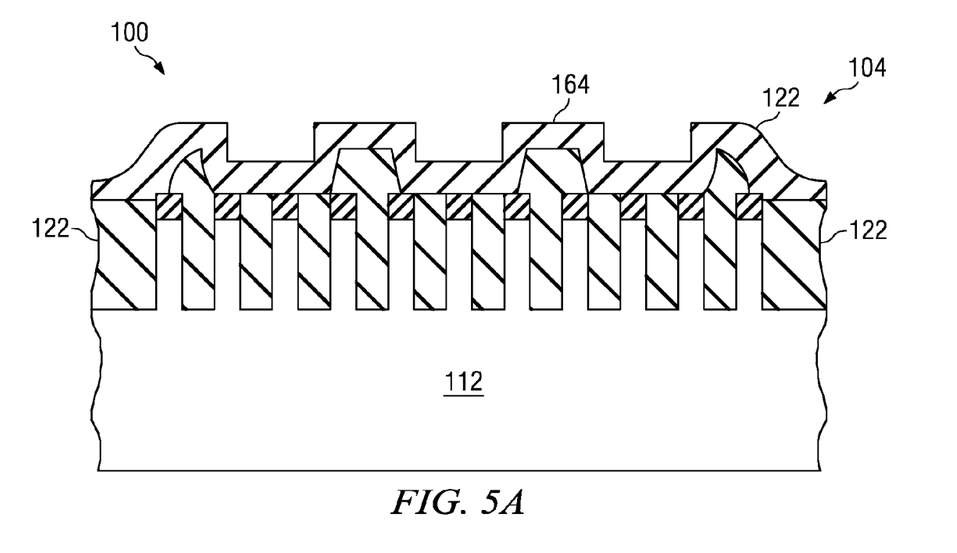
FIGS. 5A-5C illustrate the regions of FIGS. 4A-4C undergoing further processing in accordance with the present invention.
Figure 5B:
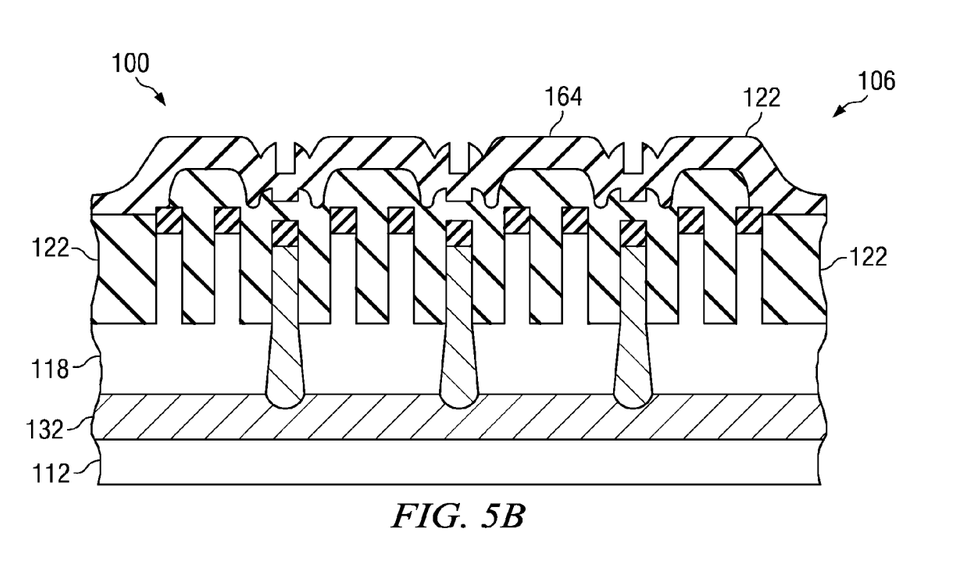
Figure 5C:
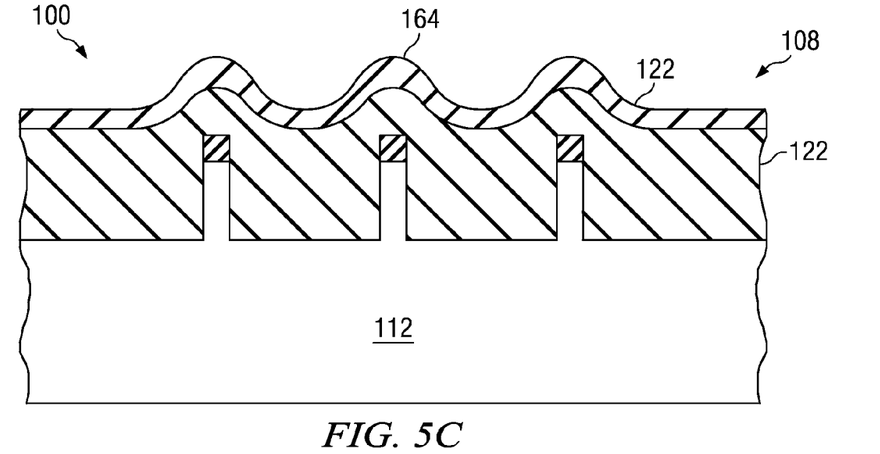
Figure 6A:
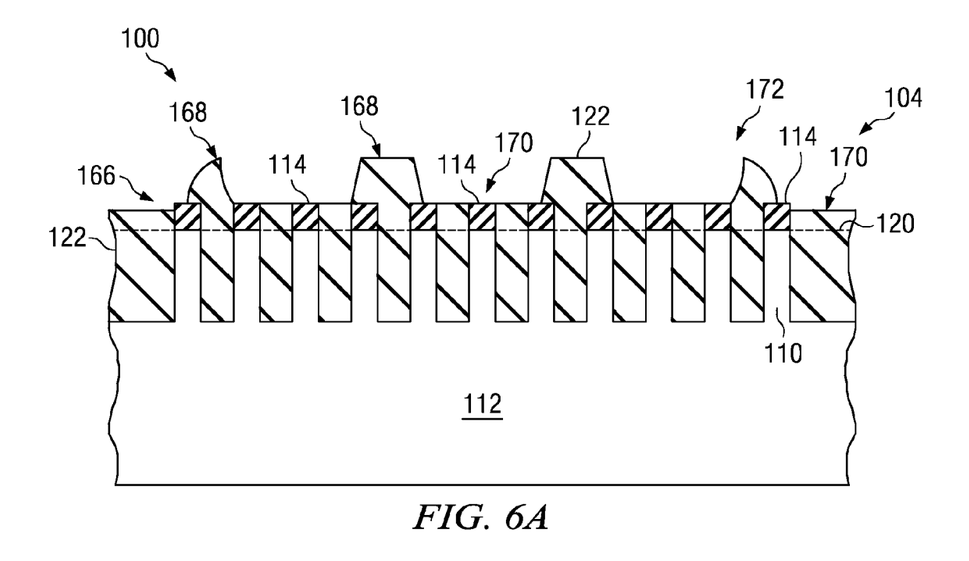
FIGS. 6A-6C illustrate the regions of FIGS. 5A-5C after undergoing further processing in accordance with the present invention.
Figure 6B:
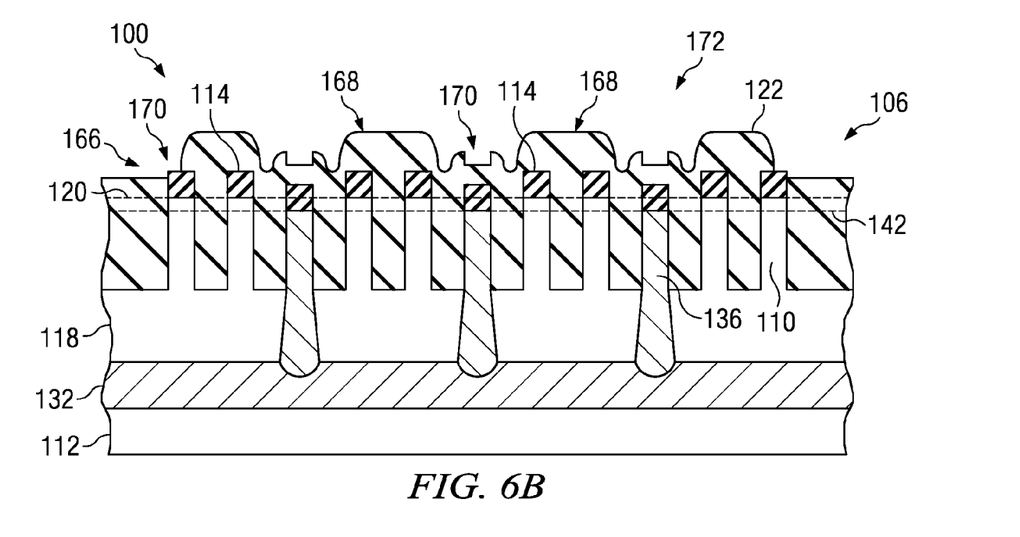
Figure 6C:
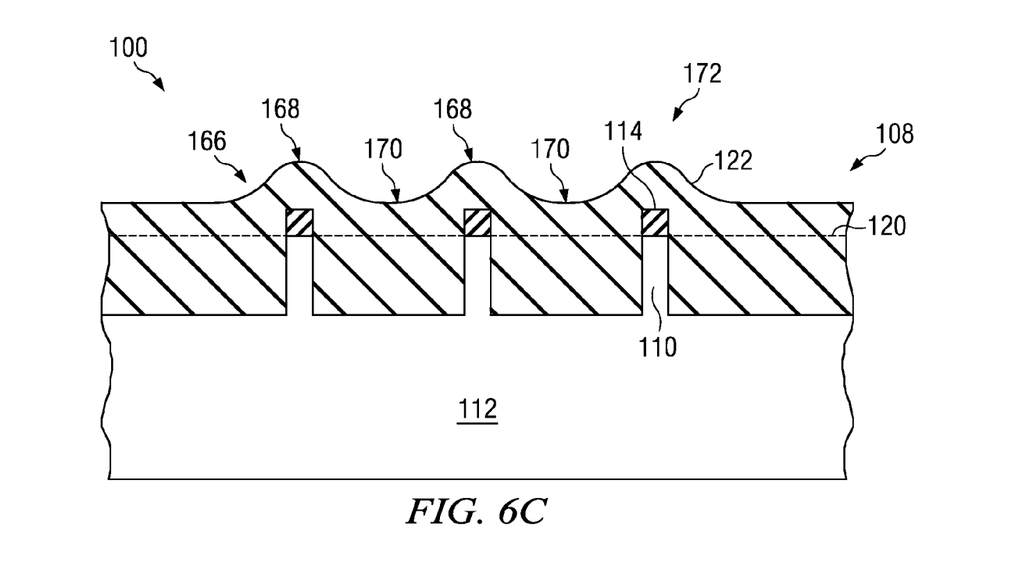

Once the workpiece 100 is anisotropically etched in act 210 of FIG. 3, a global isotropic etch is performed in act 215, wherein a second portion 164 illustrated in FIGS. 5A-5C of the isolation layer 122 is removed, therein defining a second contour 166 of the isolation layer, as illustrated in FIGS. 6A-6C. The second contour 166, for example, now has a second plurality of peaks 168 and valleys 170 associated therewith, wherein a second density 172 (second oxide density) is substantially uniform across the workpiece 100, as illustrated in FIGS. 6A-6C.

Thus, the present invention advantageously provides for a uniform and evenly distributed oxide density (the second density 172) across the workpiece 100. Accordingly, a uniform planarization or polish in subsequent processing acts may be performed, wherein portions of the isolation layer 122 overlying the plurality of features 110, including the deepN feature(s) 136 can be generally removed without damaging any of the plurality of features. For example, due to the uniform oxide density, the workpiece 100 can be subsequently polished such that the protection layer 114 overlying all of the plurality of features 110 is reached and at least a portion of the protection layer 114 is removed, while not over-polishing or damaging any of the underlying plurality of features.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor device, the method comprising:
   providing a semiconductor substrate having a substantially planar upper surface;
   etching the substrate to form: a first set of features that are spaced apart by first etched areas in a first region of the substrate; and a second set of features that are spaced apart by second etched areas in a second region of the substrate, the first set of features being spaced more densely than the second set of features;
   forming a protection layer over the first and second sets of features;
   forming an isolation layer over the substrate including within the first and second etched areas and over the protection layer, the isolation layer having a first thickness overlying a top plane of the protection layer in the first region and a second thickness overlying the top plane of the protection layer in the second region, and the first thickness being larger than the second thickness;
   performing a selective anisotropic etch followed by a global isotropic etch of the isolation layer, wherein a pattern of the anisotropic etch selectively removes portions of the isolation layer in the first region without removing portions of the isolation layer in the second region, in order to achieve via the isotropic etch a substantially uniform density of a remainder of the isolation layer overlying the top plane of the protection layer in the first and second regions; and
   following the etches, performing a planarization to remove the remainder of the isolation layer down to the top plane of the protection layer.

2. The method of claim 1, wherein the first set of features include highly doped features and other features, wherein the top plane of the protection layer in the first region includes a first top plane overlying the highly doped features and a second top plane overlying the other features, and wherein the first top plane is recessed from the second top plane.

3. The method of claim 1, wherein performing the planarization includes performing a chemical mechanical polishing.

4. The method of claim 1, wherein the first region is a low voltage component region and the second region is a high voltage component region.

5. The method of claim 4, wherein the low voltage component region is a flash memory region.

6. The method of claim 1, wherein the first set of features include highly doped features and other features, wherein the top plane of the protection layer in the first region includes a first top plane overlying the highly doped features and a second top plane overlying the other features, and wherein the first top plane is recessed from the second top plane by a step height reduction of 1000 angstroms or more.

7. The method of claim 1, wherein etching the substrate includes etching the substrate to form a third set of features that are spaced apart by third etched areas in a third region of the substrate, the third set of features being spaced more densely than the second set of features, wherein forming the protection layer includes forming the protection layer over the third set of features, and wherein forming the isolation layer includes forming; the isolation layer over the substrate including within the third etched areas, the isolation layer having a third thickness overlying the top plane of the protection layer in the third region, the third thickness being larger than the second thickness, and wherein the pattern of the anisotropic etch selectively removes portions of the isolation layer in the third region without removing portions of the isolation layer in the second region, in order to achieve via the isotropic etch the substantially uniform density of the remainder of the isolation layer overlying the top plane of the protection layer in the first, second and third regions.

8. A method of fabricating a semiconductor device, the method comprising:
    providing a semiconductor substrate having a substantially planar upper surface;
    etching the substrate to form: a first set of features that are spaced apart by first etched areas in a first region of the substrate; and a second set of features that are spaced apart by second etched areas in a second region of the substrate, the first set of features being spaced more densely than the second set of features;
    forming a nitride layer over the first and second sets of features;
    forming an oxide layer over the substrate including within the first and second etched areas and over the nitride layer, the oxide layer having a first thickness overlying a top plane of the nitride layer in the first region and a second thickness overlying the top plane of the nitride layer in the second region, and the first thickness being larger than the second thickness;
    performing a selective anisotropic etch followed by a global isotropic etch of the oxide layer, wherein a pattern of the anisotropic etch selectively removes other portions of the oxide layer in the first region without removing portions of the isolation layer in the second region, in order to achieve via the isotropic etch a substantially uniform density of a remainder of the oxide layer overlying the top plane of the nitride layer in the first and second regions; and
    following the etches, performing a chemical mechanical polish to remove the remainder of the oxide layer down to the top plane of the nitride layer.

9. The method of claim 8, wherein etching the substrate includes etching the substrate to form a third set of features that are spaced apart by third etched areas in a third region of the substrate, the third set of features being spaced more densely than the second set of features, wherein forming the nitride layer includes forming the nitride layer over the third set of features, and wherein forming the oxide layer includes forming the oxide layer over the substrate including within the third etched areas, the oxide layer having a third thickness overlying the top plane of the nitride layer in the third region the third thickness being larger than the second thickness, and wherein the pattern of the anisotropic etch selectively removes portions of the oxide layer in the third region without removing portions of the isolation layer in the second region, in order to achieve via the isotropic etch the substantially uniform density of the remainder of the oxide layer overlying the top plane of the nitride layer in the first, second and third regions.

10. The method of claim 9, wherein the first set of features include highly doped features and other features, wherein the top plane of the nitride layer in the first region includes a first top plane overlying the highly doped features and a second top plane overlying the other features, and wherein the first top plane is recessed from the second top plane.

11. The method of claim 9, wherein the first region is a low voltage component region and the second region is a high voltage component region.

12. The method of claim 11, wherein the low voltage component region is a flash memory region.

13. The method of claim 12, wherein the first set of features include highly doped features and other features, wherein the top plane of the nitride layer in the first region includes a first top plane overlying the highly doped features and a second top plane overlying the other features, and wherein the first top plane is recessed from the second top plane by a step height reduction of 1000 angstroms or more.

14. A method of fabricating a semiconductor device, the method comprising:
    providing a substrate having a first set of features that are spaced apart by first trenches in a first region, having a second set of features that are spaced apart by second trenches in a second region, and presenting a substantially planar upper surface, wherein: the first set of features are spaced more densely than the second set of features; a protection layer covers the first and second sets of features; the first set of features include highly doped features and other features; the top plane of the protection layer in the first region includes a first top plane overlying the highly doped features and a second top plane overlying the other features; and the first top plane is recessed from the second top plane;
    forming an isolation layer over the substrate including within the first and second trenches and over the protection layer, the isolation layer having a first thickness overlying a top plane of the protection layer in the first region and a second thickness overlying the top plane of the protection layer in the second region, and the first thickness being larger than the second thickness;
    performing a selective anisotropic etch followed by a global isotropic etch of the isolation layer, wherein a pattern of the anisotropic etch selectively removes portions of the isolation layer in the first region without removing portions of the isolation layer in the second region, in order to achieve via the isotropic etch a substantially uniform density of a remainder of the isolation layer overlying the top plane of the protection layer in the first and second regions; and
    following the etches, performing a planarization to remove the remainder of the isolation layer down to the top plane of the protection layer.

15. The method of claim 14, wherein the protection layer includes a nitride layer, and the isolation layer includes an oxide layer.

16. The method of claim 14, wherein: the substrate has a third set of features that are spaced apart by third trenches in a third region; the third set of features are spaced more densely than the second set of features; the protection layer also covers the third set of features; forming the isolation layer includes forming the isolation layer over the substrate including within the third trenches, the isolation layer having a third thickness overlying the top plane of the protection layer in the third region, and the third thickness being larger than the second thickness; and the pattern of the anisotropic etch selectively removes portions of the isolation layer in the third region without removing portions of the isolation layer in the second region, in order to achieve via the isotropic etch the substantially uniform density of the remainder of the isolation layer overlying the top plane of the protection layer in the first, second and third regions.

* * * * *